United States Patent
Lin et al.

(10) Patent No.: US 8,247,837 B2
(45) Date of Patent: *Aug. 21, 2012

(54) LIGHT-EMITTING DIODE WITH HIGH LIGHTING EFFICIENCY

(75) Inventors: Su-Hui Lin, Taichung (TW);
Sheng-Hsien Hsu, Taiping (TW);
Jing-Jie Dai, Changhua (TW); Tzong Liang Tsai, Taichung (TW)

(73) Assignee: Huga Optotech, Inc., Taichung (TW)

( * ) Notice: Subject to any disclaimer, the term of this patent is extended or adjusted under 35 U.S.C. 154(b) by 455 days.

This patent is subject to a terminal disclaimer.

(21) Appl. No.: 12/421,872

(22) Filed: Apr. 10, 2009

(65) Prior Publication Data
US 2010/0176419 A1     Jul. 15, 2010

(30) Foreign Application Priority Data
Jan. 13, 2009   (TW) ............................... 98101053 A

(51) Int. Cl.
*H01L 33/00* (2010.01)
(52) U.S. Cl. .................... 257/100; 257/E33.068; 438/69
(58) Field of Classification Search .............. 257/79, 257/98, 100, E33.012, E33.028; 438/47, 438/69, 493, 503, 507
See application file for complete search history.

(56) References Cited

U.S. PATENT DOCUMENTS

| | | | | |
|---|---|---|---|---|
| 5,568,499 A * | 10/1996 | Lear | ........................... | 372/45.01 |
| 5,794,839 A * | 8/1998 | Kimura et al. | ............. | 228/123.1 |
| 6,014,255 A * | 1/2000 | Van Der Wal et al. | ... | 359/485.03 |
| 6,777,871 B2 * | 8/2004 | Duggal et al. | ................ | 313/506 |
| 6,818,328 B2 * | 11/2004 | Utsumi et al. | ................. | 428/690 |
| 6,978,079 B2 * | 12/2005 | Uwada et al. | .................. | 385/147 |
| 7,221,007 B2 * | 5/2007 | Harada et al. | ............... | 257/200 |
| 7,312,570 B2 * | 12/2007 | Shiang et al. | ................. | 313/506 |
| 7,476,912 B2 * | 1/2009 | Huang et al. | .................... | 257/98 |
| 7,655,959 B2 * | 2/2010 | Lee et al. | ....................... | 257/103 |
| 7,659,557 B2 * | 2/2010 | Tsai et al. | ...................... | 257/103 |
| 7,804,104 B2 * | 9/2010 | Lin et al. | .......................... | 257/98 |
| 7,915,628 B2 * | 3/2011 | Kim | ................................ | 257/98 |
| 7,968,897 B2 * | 6/2011 | Hata et al. | ....................... | 257/98 |
| 2004/0079947 A1 * | 4/2004 | Lan et al. | ......................... | 257/79 |
| 2005/0139847 A1 * | 6/2005 | Kim et al. | ....................... | 257/98 |
| 2005/0202598 A1 * | 9/2005 | Suehiro et al. | ................ | 438/118 |
| 2006/0054907 A1 * | 3/2006 | Lai | .................................. | 257/96 |
| 2006/0076565 A1 * | 4/2006 | Murofushi et al. | ............. | 257/79 |

(Continued)

FOREIGN PATENT DOCUMENTS
JP        2003101071 A  *  4/2003
(Continued)

*Primary Examiner* — William F Kraig
(74) *Attorney, Agent, or Firm* — Chun-Ming Shih

(57) ABSTRACT

The invention discloses a light-emitting diode. In an embodiment, the light-emitting diode includes a substrate, a first doping type semiconductor layer, a second doping type semiconductor layer, a light-emitting layer and plural laminated structures. The first doping type semiconductor layer, the light-emitting layer and the second doping type semiconductor layer are formed on the substrate in sequence. The plural laminated structures are formed on the top surface of the second doping type semiconductor layer such that the top surface is partially exposed. Each laminated structure consists of plural transparent insulating layers which have their respective refractive indices. Additionally, each of the laminated structures is formed in a way of upwardly stacking the transparent insulating layers in sequence with the refractive indices of the transparent insulating layers decreasing gradually, so as to enhance the light-extraction efficiency and the lighting efficiency of the light-emitting diode.

16 Claims, 6 Drawing Sheets

U.S. PATENT DOCUMENTS

| | | | |
|---|---|---|---|
| 2006/0099449 A1* | 5/2006 | Amano et al. | 428/690 |
| 2006/0118973 A1* | 6/2006 | Harada et al. | 257/788 |
| 2007/0001570 A1* | 1/2007 | Nomura et al. | 313/113 |
| 2007/0215998 A1* | 9/2007 | Hu et al. | 257/678 |
| 2007/0267636 A1* | 11/2007 | Wu et al. | 257/79 |
| 2008/0088932 A1* | 4/2008 | Cho et al. | 359/586 |
| 2008/0157108 A1* | 7/2008 | Yu et al. | 257/98 |
| 2009/0032830 A1* | 2/2009 | Li | 257/98 |
| 2010/0148199 A1* | 6/2010 | Kim et al. | 257/98 |
| 2010/0264448 A1* | 10/2010 | Choi et al. | 257/98 |
| 2011/0163293 A1* | 7/2011 | Chung et al. | 257/13 |

FOREIGN PATENT DOCUMENTS

KR  2006014383 A * 2/2006

* cited by examiner

LIGHT-EMITTING DIODE WITH HIGH LIGHTING EFFICIENCY

BACKGROUND OF THE INVENTION

1. Field of the Invention

The invention relates to a light-emitting diode, and more particularly, to a light-emitting diode with high lighting efficiency.

2. Description of the Prior Art

Nowadays, applications of the light-emitting diode are everywhere in our daily life. There are different kinds of light-emitting diodes widely utilized in various products, e.g. key-switch systems, backlight modules, vehicle illuminations, decorating lamps, remote controllers, etc. To ensure that the light-emitting diode have better reliability and lower power consumption, it demands the light-emitting diode to maintain high lighting efficiency.

Please refer to FIG. 1. FIG. 1 is a diagram illustrating a light-emitting diode 1 in prior art. As shown in FIG. 1, the light-emitting diode 1 includes a substrate 10, an N-type GaN layer 11, a light-emitting layer 12, a P-type GaN layer 13, an electrode 14 and an electrode 15. In order to drive the P-type GaN layer 13 and the N-type GaN layer 11 for operating the light-emitting diode 1, the electrode 15 is formed on the P-type GaN layer 13 and the electrode 14 is formed on the N-type GaN layer 11.

Theoretically, the lighting efficiency of the light-emitting diode is related to the internal quantum yield and the light-extraction efficiency. The internal quantum yield is affected by characteristic and quality of the material. The light-extraction efficiency is the radio ratio defined by the radiation from the light-emitting diode to the surrounding air or the packed epoxy. Although there are lots of disclosed designs about different structures of the light-emitting diodes, it is still a critical problem to find a light-emitting diode structure capable of operating under high light-extraction efficiency and high lighting efficiency.

SUMMARY OF THE INVENTION

A scope of the invention is to provide a light-emitting diode with high lighting efficiency.

According to an embodiment of the invention, the light-emitting diode includes a substrate, a first doping type semiconductor layer, a light-emitting layer, a second doping type semiconductor layer, plural laminated structures, a transparent conductive layer, a first electrode and a second electrode. The first doping type semiconductor layer is formed on the substrate. The light-emitting layer is formed on the first doping type semiconductor layer. The second doping type semiconductor layer is formed on the light-emitting layer. The second doping type semiconductor layer has a top surface. The laminated structures are formed on the top surface of the second doping type semiconductor layer, such that the top surface is partially exposed. The transparent conductive layer is formed to cover the laminated structures and the exposed part of the top surface of the second doping type semiconductor layer. The first electrode is formed on the first doping type semiconductor layer. The second electrode is formed on the second doping type semiconductor layer.

Therein, each laminated structure is formed of a plurality of transparent insulating layers with respective refractive indices. The values of the refractive indices of the transparent insulating layers are between the value of the refractive index of the second doping type semiconductor layer and the value of the refractive index of the transparent conductive layer. Besides, each of the laminated structures is formed in a way of upwardly stacking the transparent insulating layers in sequence with the refractive indices of the transparent insulating layers decreasing gradually.

According to another embodiment of the invention, the light-emitting diode includes a substrate, a first doping type semiconductor layer, a light-emitting layer, a second doping type semiconductor layer, plural laminated structures, a transparent conductive layer, a first electrode and a second electrode.

The first doping type semiconductor layer is formed on the substrate. The light-emitting layer is formed on the first doping type semiconductor layer. The second doping type semiconductor layer is formed on the light-emitting layer. The second doping type semiconductor layer has a top surface. The top surface includes a first area and a second area other than the first area. The laminated structures are formed on the first area of the top surface, such that the first area is partially exposed. The transparent conductive layer is formed to cover the laminated structures and the exposed part of the first area of the second doping type semiconductor layer. The first electrode is formed to cover the second area and part of the transparent conductive layer. The second electrode is formed on the first doping type semiconductor layer.

Therein, each laminated structure is formed of a plurality of transparent insulating layers with respective refractive indices. The values of the refractive indices of the transparent insulating layers are between the value of the refractive index of the second doping type semiconductor layer and the value of the refractive index of the transparent conductive layer. Besides, each of the laminated structures is formed in a way of upwardly stacking the transparent insulating layers in sequence with the refractive indices of the transparent insulating layers decreasing gradually.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
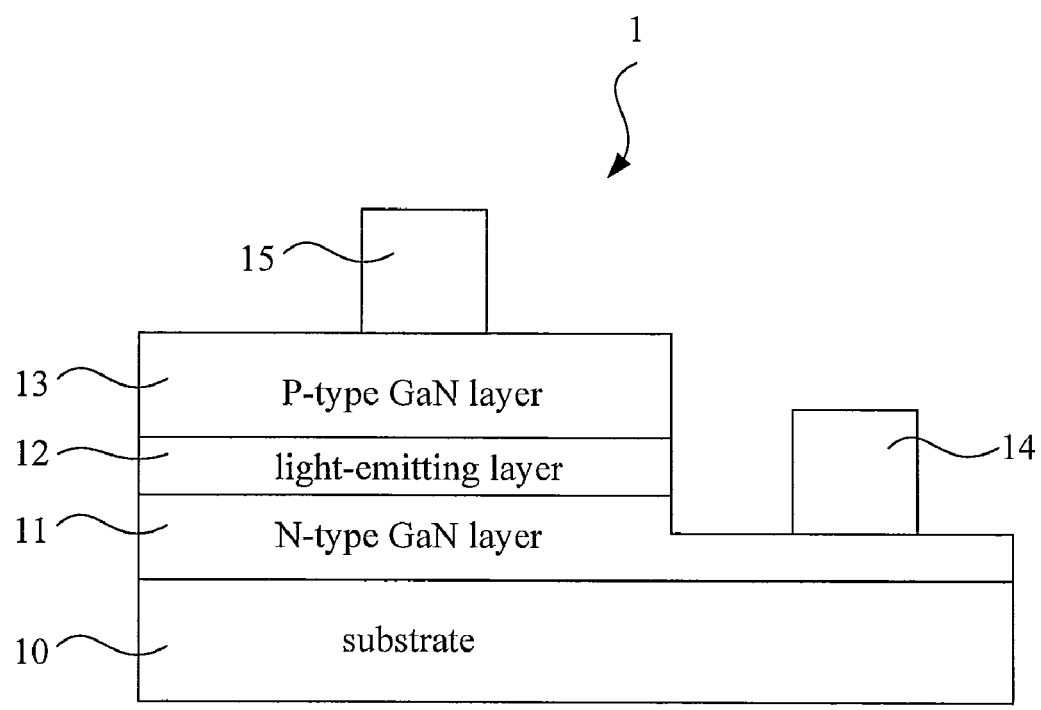
FIG. 1 is a diagram illustrating a light-emitting diode in prior art.
Figure 2A:
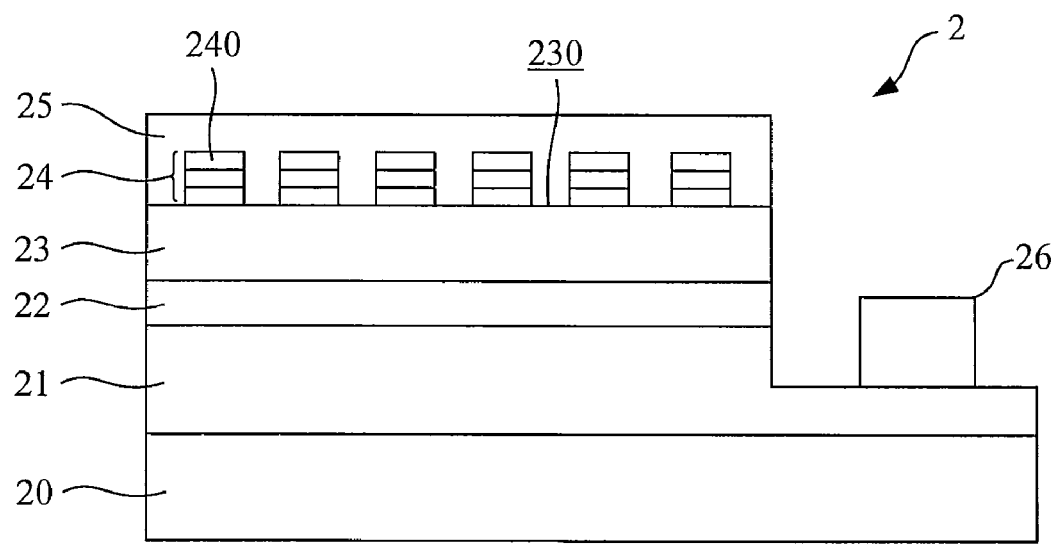
FIG. 2A is a sectional view illustrating a light-emitting diode according to an embodiment of the invention.

Please refer to FIG. 2A. FIG. 2A is a sectional view illustrating a light-emitting diode 2 according to an embodiment of the invention.

As shown in FIG. 2A, the light-emitting diode 2 includes a substrate 20, a first doping type semiconductor layer 21, a light-emitting layer 22, a second doping type semiconductor layer 23, a plurality of laminated structures 24, a transparent conductive layer 25 and an electrode 26.

The first doping type semiconductor layer 21 is formed on the substrate 20. The light-emitting layer 22 is formed on the first doping type semiconductor layer 21. The second doping type semiconductor layer 23 is formed on the light-emitting layer 22. The second doping type semiconductor layer 23 has a top surface.

In practical application, the substrate 20 can be formed of a $SiO_2$, Si, Ge, GaN, GaAs, GaP, AlN, sapphire, spinel, SiC, ZnO, MgO, $LiAlO_2$, or $MgAl_2O_4$ material, but not limited to these materials. The first doping type semiconductor layer 21 and the second doping type semiconductor layer 23 can be a nitride material. In an embodiment, the first doping type can be N-type, and the second doping type can be P-type. For example, the first doping type semiconductor layer 21 can be N-type GaN layer, and the second doping type semiconductor layer 23 can be P-type GaN layer.

Figure 2B:
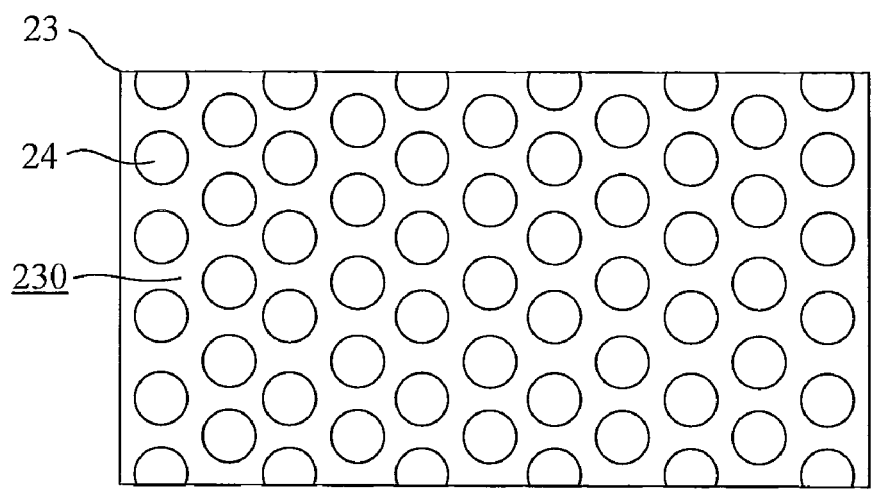
FIG. 2B is a top view of the second doping type semiconductor layer in FIG. 2A.

The laminated structures 24 are independently formed on the top surface of the second doping type semiconductor layer 23, such that the top surface is partially exposed. Please refer to FIG. 2B. FIG. 2B is a top view of the second doping type semiconductor layer 23 in FIG. 2A. As shown in FIG. 2B, in an embodiment, the laminated structures can be, but not limited to, rod-shaped structures. There are gaps existed between the laminated structures 24. Therefore, after the laminated structures 24 being formed, part of the top surface of the second doping type semiconductor layer 23 is exposed (as the exposed part 230 shown in FIG. 2B). To be noticed that, each laminated structure 24 is formed of a plurality of transparent insulating layers 240. The transparent insulating layers 240 have respective refractive indices.

The transparent conductive layer 25 is formed to cover the laminated structures 24 and the exposed part 230 of the top surface of the second doping type semiconductor layer 23. The electrode 26 is formed on the first doping type semiconductor layer 21, which is partially etched. In practical application, the transparent conductive layer 25 can be made of, but not limited to, an ITO material.

To be noticed that, to each laminated layer 24, the values of the refractive indices of the transparent insulating layers 240 are between the value of the refractive index of the second doping type semiconductor layer 23 and the value of the refractive index of the transparent conductive layer 25. Each laminated structure 24 is formed in a way of upwardly stacking the transparent insulating layers 240 in sequences with the refractive indices of the transparent insulating layers 240 decreasing gradually. Besides, each laminated structure 24 can be made of at least two materials selected from the group consisting of a $SiO_2$ layer, a $TiO_2$ layer, a $Ta_2O_5$ layer and a $Si_3N_4$ layer.

Figure 2C:
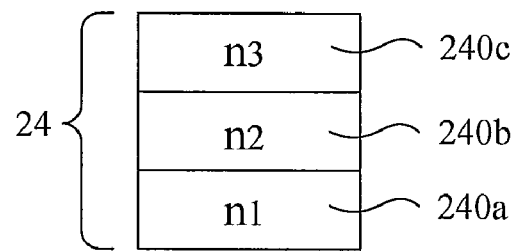
FIG. 2C is a structural view of the laminated structure according to an embodiment.

Please refer to FIG. 2C. FIG. 2C is a structural view of the laminated structure 24 according to an embodiment. As shown in FIG. 2C, the laminated structure 24 may include three transparent insulating layers (240a, 240b, 240c), which respectively have refractive indices n1, n2 and n3, wherein n1>n2>n3, i.e. the refractive indices of the three transparent insulating layers are decreasing gradually from bottom to top. To be noticed that, the number of the transparent insulating layers and the refractive indices rule within each laminated structure 24 can be designed according to the practical application.

There are two major advantages of the light-emitting diode in the invention:

(1) Because the refractive indices of transparent insulating layers of each laminated structure 24 are decreasing gradually from bottom to top, when a light, generated by the light-emitting, layer 22 illuminates through the laminated structures 24, the possibility of the light being reflected by the laminated structures 24 can be reduced, based on the graded refractive index function. In other words, the transmittance of the illuminating light can be elevated. In this way, the light generated by the light-emitting layer 22 can be projected out of the light-emitting diode 2, so as to improve the light-extraction efficiency.

(2) After the light-emitting diode 2 being charged, a current flows between the second doping type semiconductor layer 23 and the transparent conductive layer 25. Because the plural laminated structures 24 are formed by the transparent insulating layers and there are gaps between the laminated structures 24, the current is blocked by the laminated structures 24 and only capable of flowing through the gaps between the laminated structures 24. Therefore, the current density can be elevated by the laminated structures 24, so as to improve the lighting efficiency of the light-emitting diode.

Figure 2D:
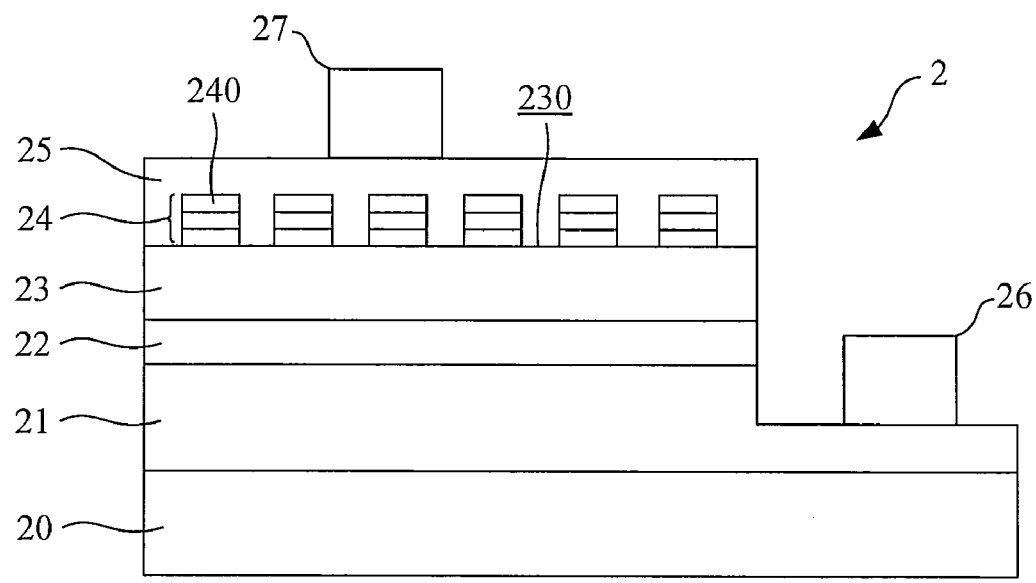
FIG. 2D is a diagram illustrating the light-emitting diode in FIG. 2A further including another electrode.

Please refer to FIG. 2D. FIG. 2D is a diagram illustrating the light-emitting diode 2 in FIG. 2A further including another electrode 27, which is formed on the transparent conductive layer 25. In practical applications, both of the electrodes 26, 27 can be made of a Cr—Au alloy.

Figure 2E:
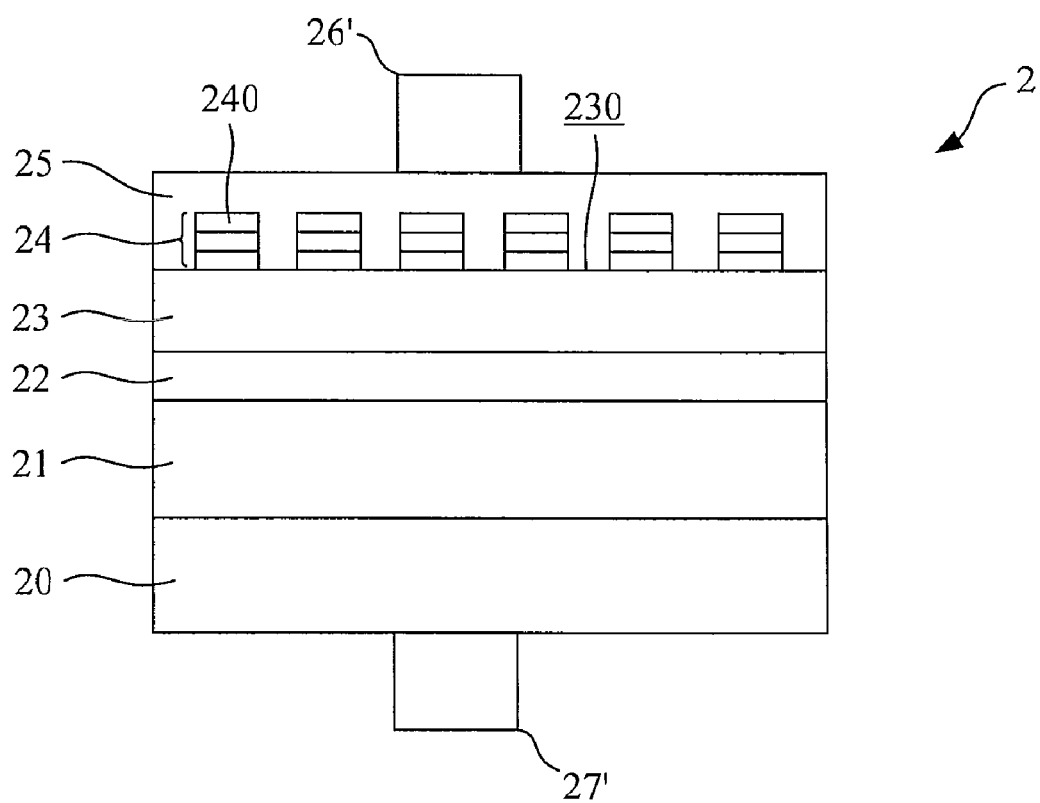
FIG. 2E is a sectional view illustrating the light-emitting diode according to another embodiment of the invention.

Please refer to FIG. 2E. FIG. 2E is a sectional view illustrating the light-emitting diode 2 according to another embodiment of the invention. The main difference between the light-emitting diodes in FIG. 2D and the FIG. 2E is that the electrodes (26', 27') of the light-emitting diode 2 in FIG. 2E are respectively formed on the transparent conductive layer 25 and a bottom surface of the substrate 20. To be noticed that, the substrate 20 in this embodiment is made of a conductive material. Besides, the advantage of the light-emitting diode in this embodiment is that the light-emitting layer 22 needs no etching, such that the active lighting area is enlarged.

Figure 3A:
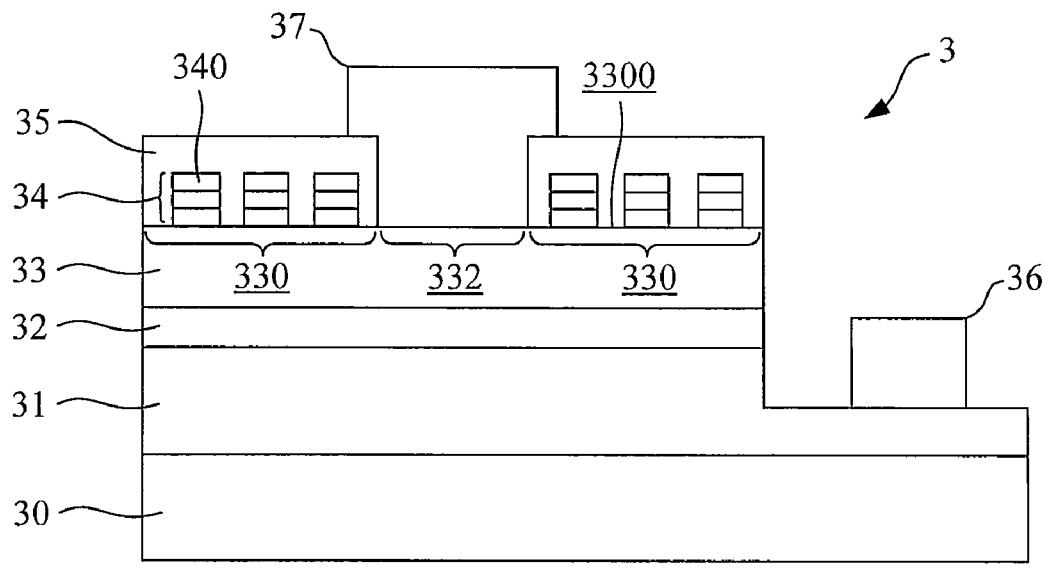
FIG. 3A is a sectional view illustrating a light-emitting diode according to another embodiment of the invention.

Please refer to FIG. 3A. FIG. 3A is a sectional view illustrating a light-emitting diode 3 according to another embodiment of the invention.

The light-emitting diode 3 includes a substrate 30, a first doping type semiconductor layer 31, a light-emitting layer 32, a second doping type semiconductor layer 33, plural laminated structures 34, a transparent conductive layer 35, a first electrode 36 and a second electrode 37.

The first doping type semiconductor layer 31 is formed on the substrate 30. The light-emitting layer 32 is formed on the first doping type semiconductor layer 31. The second doping type semiconductor layer 33 is formed on the light-emitting layer 32. The second doping type semiconductor layer 33 has a top surface. The top surface includes a first area 330 and a second area 332 other than the first area 330. The laminated structures 34 are formed on the first area 330 of the top surface, such that the first area 330 is partially exposed. The transparent conductive layer 35 is formed to cover the laminated structures 34 and the exposed part of the first area 330 of the second doping type semiconductor layer 33. The first electrode 36 is formed on the first doping type semiconductor layer 31. The second electrode 37 is formed to cover the second area 332 and part of the transparent conductive layer 35.

Figure 3B:
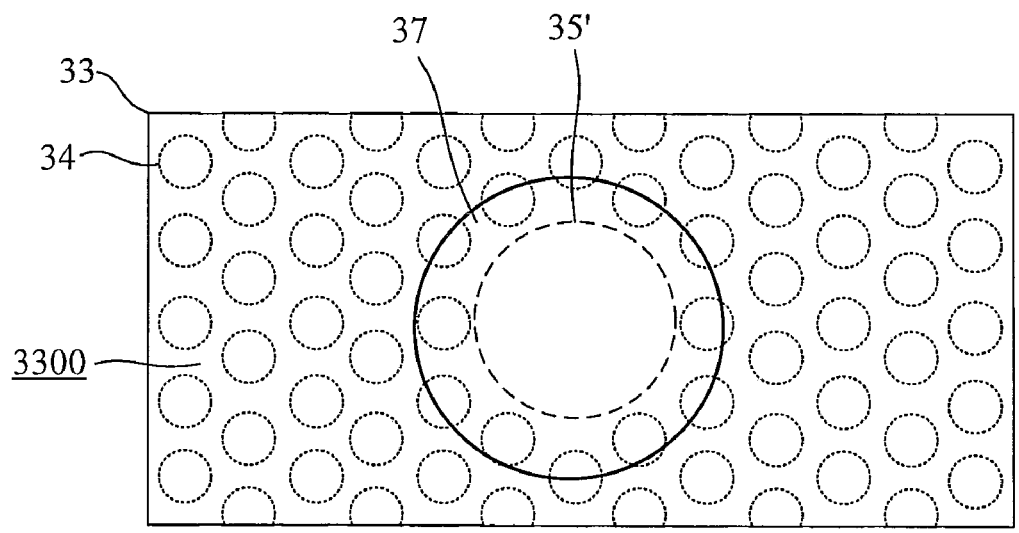
FIG. 3B is a top view of the second doping type semiconductor layer in FIG. 3A.

Please refer to FIG. 3B. FIG. 3B is a top view of the second doping type semiconductor layer 33 in FIG. 3A. There are gaps existed between the laminated structures 34. Therefore, after the laminated structures 34 being formed, part of the first area 330 of the top surface of the second doping type semiconductor layer 33 is exposed (as the exposed part 3300 shown in FIG. 3B). Besides, boundary 35' represents the bounding edge of the transparent conductive layer 35. The detail description about the formation and function of the lamination structures 34 is mentioned in the aforesaid paragraphs, not to be repeated again.

In addition, the second electrode 37 in FIG. 3A contacts the second doping type semiconductor layer 33 and the transparent conductive layer 35 at the same time. In the reason of the impedance between the second electrode 37 and the second doping type semiconductor layer 33 being larger than the impedance between the transparent conductive layer 35 and the second doping type semiconductor layer 33, it has an advantage that the current tends to flow toward the transparent conductive layer 35. In other words, the current density of the current toward the transparent conductive layer 35 is elevated, so as to improve the lighting efficiency.

Figure 3C:
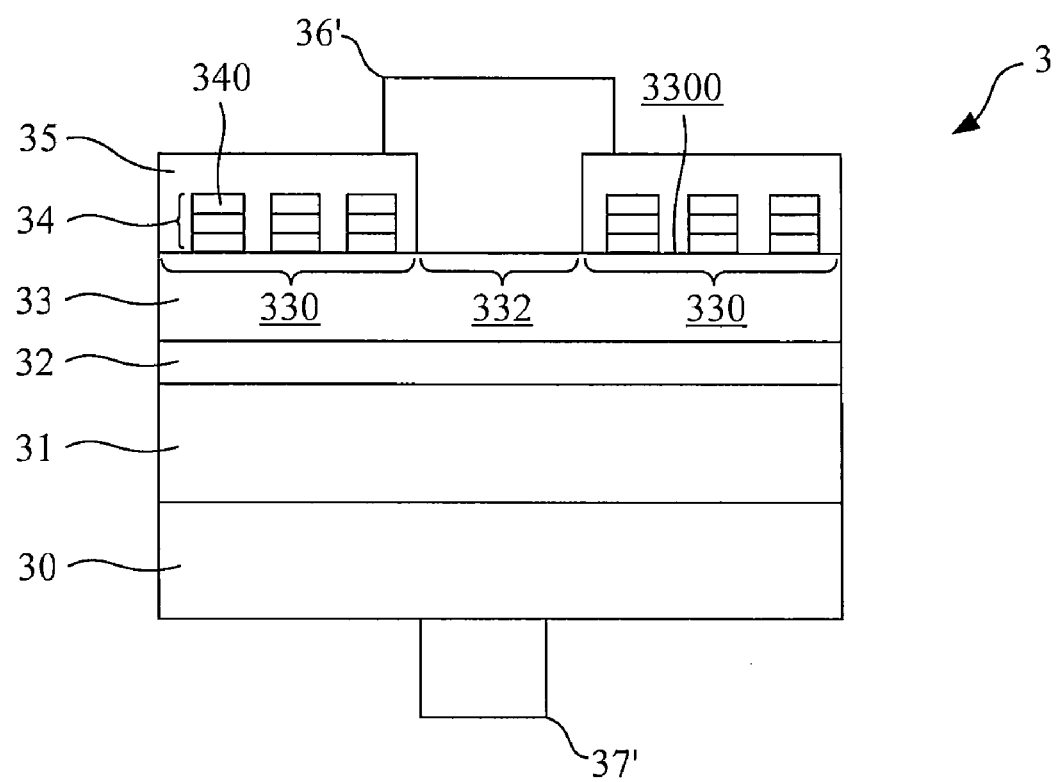
FIG. 3C is a sectional view illustrating the light-emitting diode according to another embodiment of the invention.

Please refer to FIG. 3C. FIG. 3C is a sectional view illustrating the light-emitting diode 3 according to another embodiment of the invention. The main difference between the light-emitting diodes in FIG. 3C and the FIG. 3A is that the electrodes 36' of the light-emitting diode 3 in FIG. 3C is formed to cover the second area 332 and part of the transparent conductive layer 35, and the electrodes 37' of the light-emitting diode 3 in FIG. 3C is formed on a bottom surface of the substrate 30. To be noticed that, the substrate 30 in this embodiment is made of a conductive material. Besides, the advantage of the light-emitting diode in this embodiment is that the light-emitting layer 32 needs no etching, such that the active lighting area is enlarged.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A light-emitting diode with high lighting efficiency, comprising:
    a substrate;
    a first doping type semiconductor layer formed on the substrate;
    a light-emitting layer formed on the first doping type semiconductor layer;
    a second doping type semiconductor layer formed on the light-emitting layer, the second doping type semiconductor layer having a top surface;
    a plurality of laminated structures formed on the top surface of the second doping type semiconductor layer such that the top surface is partially exposed, wherein each laminated structure is formed of a plurality of transparent insulating layers with respective refractive indices, and a plurality of gaps are formed between the laminated structures; and
    a transparent conductive layer formed to cover the laminated structures and the exposed part of the top surface of the second doping type semiconductor layer, wherein the transparent conductive layer passes through the gaps between the laminated structures and directly contacts the exposed part of the top surface of the second doping type semiconductor layer;
wherein the values of the refractive indices of the transparent insulating layers are between the value of the refractive index of the second doping type semiconductor layer and the value of the refractive index of the transparent conductive layer, each of the laminated structures is formed in a way of upwardly stacking the transparent insulating layers in sequence with the refractive indices of the transparent insulating layers decreasing gradually.

2. The light-emitting diode of claim 1, wherein each laminated structure is made of at least two materials selected from the group consisting of a SiO2 layer, a TiO2 layer, a Ta2O5 layer and a Si3N4 layer.

3. The light-emitting diode of claim 1, further comprising a first electrode and a second electrode, the first electrode being formed on the first doping type semiconductor layer, the second electrode being formed on the transparent conductive layer.

4. The light-emitting diode of claim 3, wherein the first electrode and the second electrode are both made of a Cr—Au alloy.

5. The light-emitting diode of claim 1, further comprising a first electrode and a second electrode, the first electrode being formed on a bottom surface of the substrate, the second electrode being formed on the transparent conductive layer.

6. The light-emitting diode of claim 1, wherein the first doping type semiconductor layer is N-type, and the second doping type semiconductor layer is P-type.

7. The light-emitting diodes of claim 1, wherein the first doping type semiconductor layer and the second doping type semiconductor layer are both made of a nitride material.

8. The light-emitting diode of claim 1, wherein the transparent conductive layer is made of an ITO material.

9. A light-emitting diode with high lighting efficiency, comprising:
    a substrate;
    a first doping type semiconductor layer formed on the substrate;
    a light-emitting layer formed on the first doping type semiconductor layer;
    a second doping type semiconductor layer formed on the light-emitting layer, the second doping type semiconductor layer having a top surface, the top surface comprising a first area and a second area other than the first area;
    a plurality of laminated structures formed on the first area, such that the first area is partially exposed, wherein each laminated structure is formed of a plurality of transparent insulating layers with respective refractive indices, and a plurality of gaps are formed between the laminated structures; and
    a transparent conductive layer formed to cover the laminated structures and the exposed part of the first area of the second doping type semiconductor layer, wherein the transparent conductive layer passes through the gaps between the laminated structures and directly contacts the exposed part of the first area of the top surface of the second doping type semiconductor layer;
    a first electrode formed to cover the second area and part of the transparent conductive layer;
wherein the values of the refractive indices of the transparent insulating layers are between the value of the refractive index of the second doping type semiconductor layer and the value of the refractive index of the transparent conductive layer, each of the laminated structures is formed in a way of upwardly stacking the transparent insulating layers in sequence with the refractive indices of the transparent insulating layers decreasing gradually.

10. The light-emitting diode of claim 9, wherein each laminated structure is made of at least two materials selected from the group consisting of a SiO2 layer, a TiO2 layer, a Ta2O5 layer and a Si3N4 layer.

11. The light-emitting diode of claim 9, further comprising a second electrode formed on the first doping-type semiconductor layer.

12. The light-emitting diode of claim 11, wherein the first electrode and the second electrode are both made of a Cr—Au alloy.

13. The light-emitting diode of claim 9, further comprising a second electrode formed on a bottom surface of the substrate.

14. The light-emitting diode of claim 9, wherein the first doping type semiconductor layer is N-type, and the second doping type semiconductor layer is P-type.

15. The light-emitting diodes of claim 9, wherein the first doping type semiconductor layer and the second doping type semiconductor layer are both made of a nitride material.

16. The light-emitting diode of claim 9, wherein the transparent conductive layer is made of an ITO material.

* * * * *